(12) United States Patent
Mikhalev et al.

(10) Patent No.: US 8,853,833 B2
(45) Date of Patent: Oct. 7, 2014

(54) ELECTROMAGNETIC SHIELD AND ASSOCIATED METHODS

(75) Inventors: Vladimir Mikhalev, Boise, ID (US); Michael Smith, Boise, ID (US); Henry J. Fulford, Meridian, ID (US); Puneet Sharma, Boise, ID (US); Zia A. Shafi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 561 days.

(21) Appl. No.: 13/159,203

(22) Filed: Jun. 13, 2011

(65) Prior Publication Data

US 2012/0313691 A1 Dec. 13, 2012

(51) Int. Cl.
*H01L 23/552* (2006.01)
*H01L 23/522* (2006.01)

(52) U.S. Cl.
CPC .................................. *H01L 23/5225* (2013.01)
USPC .................. 257/659; 257/208; 257/E23.114; 257/E27.01

(58) Field of Classification Search
CPC .......................... H01L 23/5225; H01L 23/552
USPC ............ 257/208, 534, 659, E23.114, E27.01; 327/534
See application file for complete search history.

(56) References Cited

U.S. PATENT DOCUMENTS

| 5,471,082 | A | * | 11/1995 | Maeda | 257/362 |
| 5,859,466 | A | * | 1/1999 | Wada | 257/508 |
| 5,930,178 | A | | 7/1999 | Hsu et al. | |
| 6,420,741 | B1 | * | 7/2002 | Nakajima | 257/295 |
| 7,130,233 | B2 | | 10/2006 | Huang | |
| 7,173,861 | B2 | | 2/2007 | Cho et al. | |
| 7,499,327 | B2 | | 3/2009 | Kwak | |
| 7,576,382 | B2 | * | 8/2009 | Ueno | 257/306 |
| 7,724,577 | B2 | | 5/2010 | Goda et al. | |
| 2004/0232510 | A1 | * | 11/2004 | Petruzzello et al. | 257/491 |
| 2006/0044872 | A1 | | 3/2006 | Nazarian | |
| 2006/0065924 | A1 | * | 3/2006 | Yilmaz | 257/328 |
| 2009/0175081 | A1 | | 7/2009 | Kim | |
| 2012/0032276 | A1 | * | 2/2012 | Do et al. | 257/401 |

\* cited by examiner

*Primary Examiner* — Tuan N. Quach
(74) *Attorney, Agent, or Firm* — Schwegman Lundberg & Woessner, P.A.

(57) ABSTRACT

Semiconductor devices are described, along with methods and systems that include them. One such device includes a diffusion region in a semiconductor material, a terminal coupled to the diffusion region, and a field plate coupled to the terminal and extending from the terminal over the diffusion region to shield the diffusion region. Additional embodiments are also described.

23 Claims, 6 Drawing Sheets

ELECTROMAGNETIC SHIELD AND ASSOCIATED METHODS

BACKGROUND

Semiconductor devices are widely used in many electronic goods such as personal digital assistants (PDAs), laptop computers, mobile phones and digital cameras. Semiconductor devices include circuits formed in semiconductor material, such as silicon. Metallizations are lines of metal that couple (e.g., electrically connect) semiconductor devices together and allow the semiconductor devices to communicate with each other and the outside world. Unwanted electromagnetic coupling sometimes occurs in semiconductor devices located near metallizations.

BRIEF DESCRIPTION OF THE DRAWINGS

Some embodiments are illustrated by way of example and not limitation in the figures of the accompanying drawings in which.

DETAILED DESCRIPTION

The inventors have discovered that the challenge noted above, as well as others, can be addressed with field plates to shield semiconductor devices from electromagnetic activity in nearby structures, such as conductors (e.g., metallizations).

Figure 1:
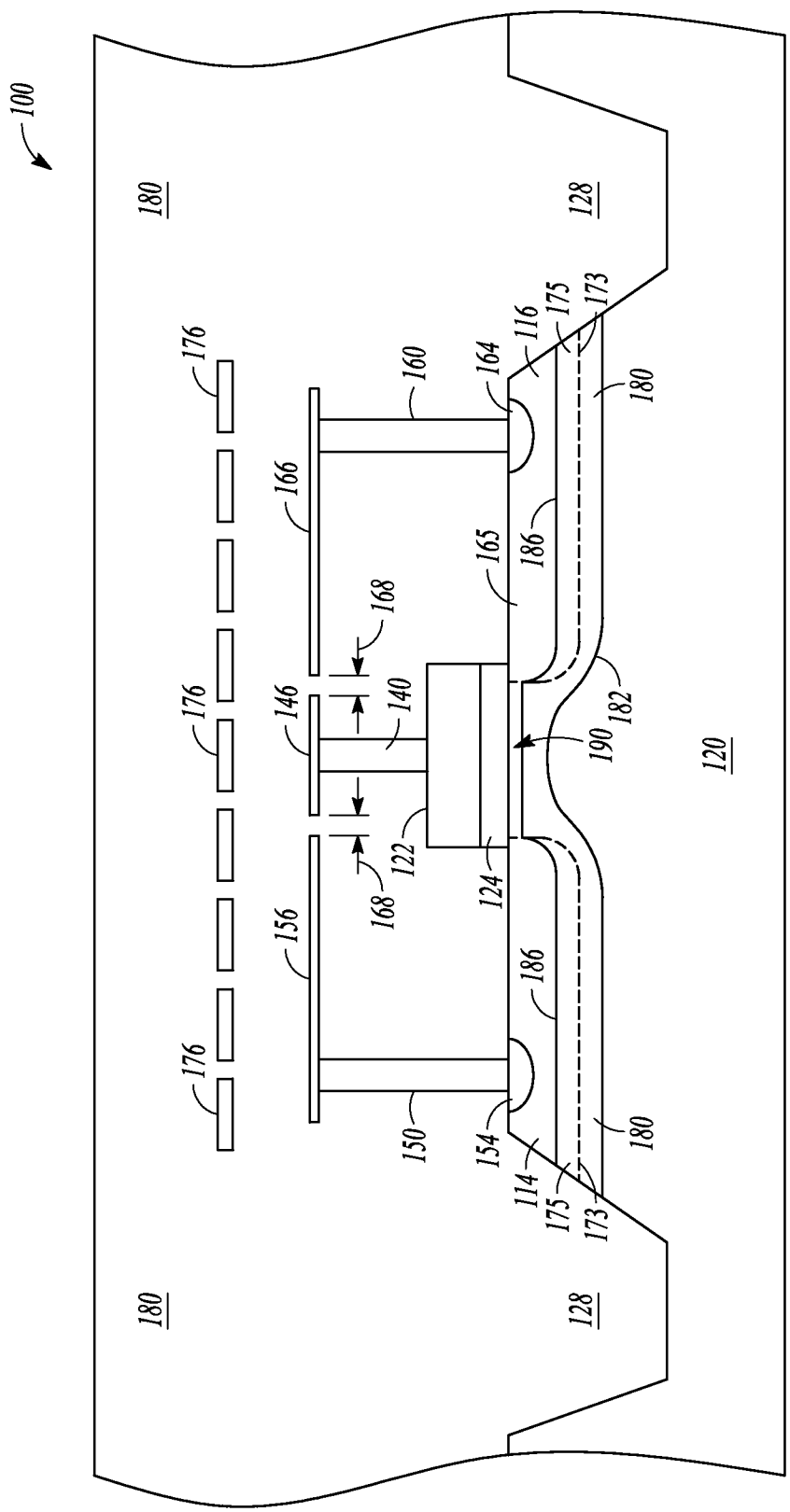
FIG. 1 is a cross-sectional view of a field-effect transistor (FET) according to various embodiments of the invention.

FIG. 1 is a cross-sectional view of a field-effect transistor (FET) 100 according to various embodiments of the invention. An N− type source diffusion region 114 and an N− type drain diffusion region 116 are formed in a P type semiconductor material, such as a silicon substrate 120. A polysilicon gate electrode 122 is formed over a gate dielectric 124 which is formed over the silicon substrate 120 between the source diffusion region 114 and the drain diffusion region 116. The gate dielectric 124 may comprise, for example, silicon dioxide ($SiO_{(2)}$), oxynitride or nitrided oxide, according to some embodiments of the invention. A trench 128 in the silicon substrate 120 surrounds an active area of the FET 100. The source diffusion region 114 and the drain diffusion region 116 are formed in the silicon substrate 120 inside the trench 128.

The FET 100 may comprise a P channel FET with a P− type source diffusion region and a P− type drain diffusion region formed in an N type silicon substrate according to some embodiments of the invention. The gate electrode 122 may comprise metal rather than polysilicon according to some embodiments of the invention.

The gate electrode 122 is coupled (e.g., connected) to a gate terminal 140 that is an elongated structure extending from the gate electrode 122. A gate terminal head 146 sits on the gate terminal 140. A source terminal 150 is an elongated structure extending from a first N+ type contact diffusion region 154 inside the source diffusion region 114. A drain terminal 160 is an elongated structure extending from a second N+ type contact diffusion region 164 inside the drain diffusion region 116. The portion of the drain diffusion region 116 between the gate dielectric 124 and the contact diffusion region 164 may be called a drain extension region 165. The source terminal 150 includes a source terminal field plate 156 that extends laterally from the source terminal 150 toward the gate terminal head 146 over the source diffusion region 114. The drain terminal 160 includes a drain terminal field plate 166 that extends laterally from the drain terminal 160 toward the gate terminal head 146 over the drain diffusion region 116. The field plates 156 and 166 may extend up to or beyond the active area of the FET 100 defined by the trench 128 in the silicon substrate 120. The field plates 156 and 166 serve to shield the silicon substrate 120 from electromagnetic activity in conductors above the silicon substrate 120 as will be described hereinbelow.

The gate terminal 140, the gate terminal head 146, the drain terminal 160, the drain terminal field plate 166, the source terminal 150 and the source terminal field plate 156 are conductors, and each comprises, for example, any one or more of polysilicon, aluminum, copper, tungsten, or another metal. The gate terminal 140, the gate terminal head 146, the drain terminal 160, the drain terminal field plate 166, the source terminal 150 and the source terminal field plate 156 may comprise the same material or different materials. The drain terminal 160 and the drain terminal field plate 166 may be fabricated integrally at the same time or at different times such that they are in electrical contact and have approximately the same potential as the second N+ type contact diffusion region 164 and the drain diffusion region 116. The source terminal 150 and the source terminal field plate 156 may be fabricated integrally at the same time or at different times such that they are in electrical contact and have approximately the same potential as the first N+ type contact diffusion region 154 and the source diffusion region 114. The gate terminal 140 and the gate terminal head 146 may be fabricated integrally at the same time or at different times such that they are in electrical contact and have approximately the same potential as the gate electrode 122.

Gaps 168 filled with a dielectric separate the gate terminal head 146 from the source terminal field plate 156 and the drain terminal field plate 166 such that each may have a different potential. The gaps 168 are approximately 140 nanometers wide, and in some embodiments are about 137.5 nanometers wide. The gaps 168 leave room for channels to be routed between the field plates 156 and 166 and the gate terminal head 146.

A dashed line illustrates a metallurgical junction 173 between the source and drain diffusion regions 114 and 116 and the silicon substrate 120, and depletion regions exist on both sides of the metallurgical junction 173. A depletion region 175 exists within the source and drain diffusion regions 114 and 116, and a depletion region 180 exists within the silicon substrate 120 above a line 182. The silicon substrate 120 below the line 182 is undepleted. The source and drain diffusion regions 114 and 116 above a line 186 are also undepleted.

During powered operation of the FET 100, an inverted channel region 190 occurs above the line 186 when a voltage on the gate electrode 122 exceeds a threshold voltage of the FET 100. Charge may pass between the source diffusion region 114 and the drain diffusion region 116 through the channel region 190. The channel region 190 does not exist when the voltage on the gate electrode 122 is not high enough, and the depletion region 180 within the silicon substrate 120 extends up to the gate dielectric 124.

A number of lines of metal 176 extend over the silicon substrate 120 and all of the features of the FET 100 including the terminals 140, 150 and 160, the gate terminal head 146, the source terminal field plate 156 and the drain terminal field plate 166. The lines of metal 176 may be access lines carrying a relatively high voltage, such as about 30 volts. The lines of metal 176 may also comprise, for example, aluminum, copper or tungsten according to some embodiments of the invention. The FET 100 is covered by a dielectric 180 that extends into the trench 128 and the gaps 168 and surrounds the terminals 140, 150 and 160, the gate terminal head 146, the field plates 156 and 166 and the lines of metal 176. The dielectric 180 may comprise, for example, silicon dioxide, silicon oxide, silica or Borophosphosilicate glass (BPSG) according to some embodiments of the invention.

Figure 2:
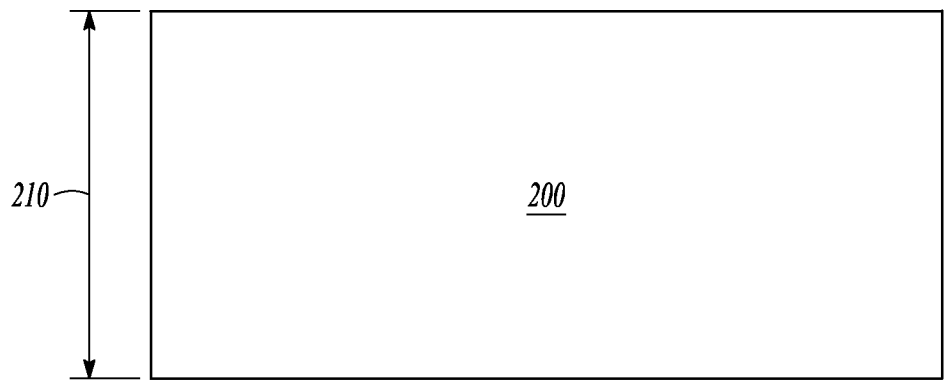
FIG. 2 is a top view of a field plate according to various embodiments of the invention.

An example of one or both of the field plates 156 and 166 is shown in FIG. 2. FIG. 2 is a top view of a field plate 200 according to various embodiments of the invention. The field plate 200 is a substantially rectangular block of metal that is coupled to a terminal of a FET such as one of the terminals 150 and 160 of the FET 100 shown in FIG. 1. The field plate 200 has a width 210 that is at least as wide as an active area of the FET 100 and may even be larger to extend over the trench 128. The field plate 200 may also comprise, for example, aluminum, copper, tungsten, or polysilicon.

Figure 3:
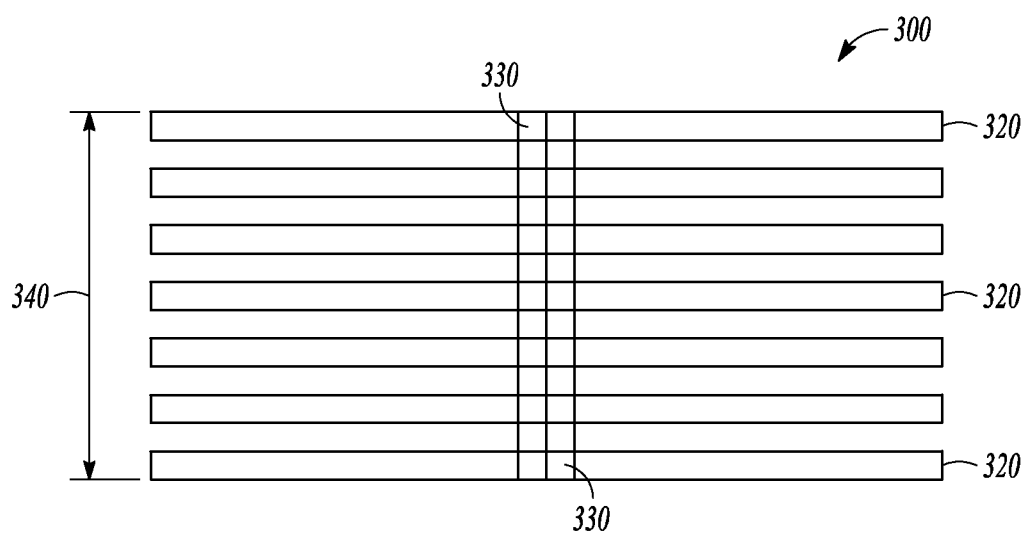
FIG. 3 is a top view of a field plate according to various embodiments of the invention.

An example of one or both of the field plates 156 and 166 is shown in FIG. 3. FIG. 3 is a top view of a field plate 300 according to various embodiments of the invention. The field plate 300 is made up of individual bars 320 of metal that are coupled together by crossbeams 330 of metal. The bars 320 and the crossbeams 330 each have a length, a width and a thickness. The bars 320 and the crossbeams 330 may also comprise, for example, any one or more of aluminum, copper, tungsten, or polysilicon according to some embodiments of the invention. The field plate 300 may comprise the bars 320 without the crossbeams 330 according to some embodiments of the invention. The field plate 300 has a width 340 that is at least as wide as an active area of the FET 100 and may even be larger to extend over the trench 128. The bars 320 may be substantially parallel with or perpendicular to the width 340 of the FET 100.

Figure 4:
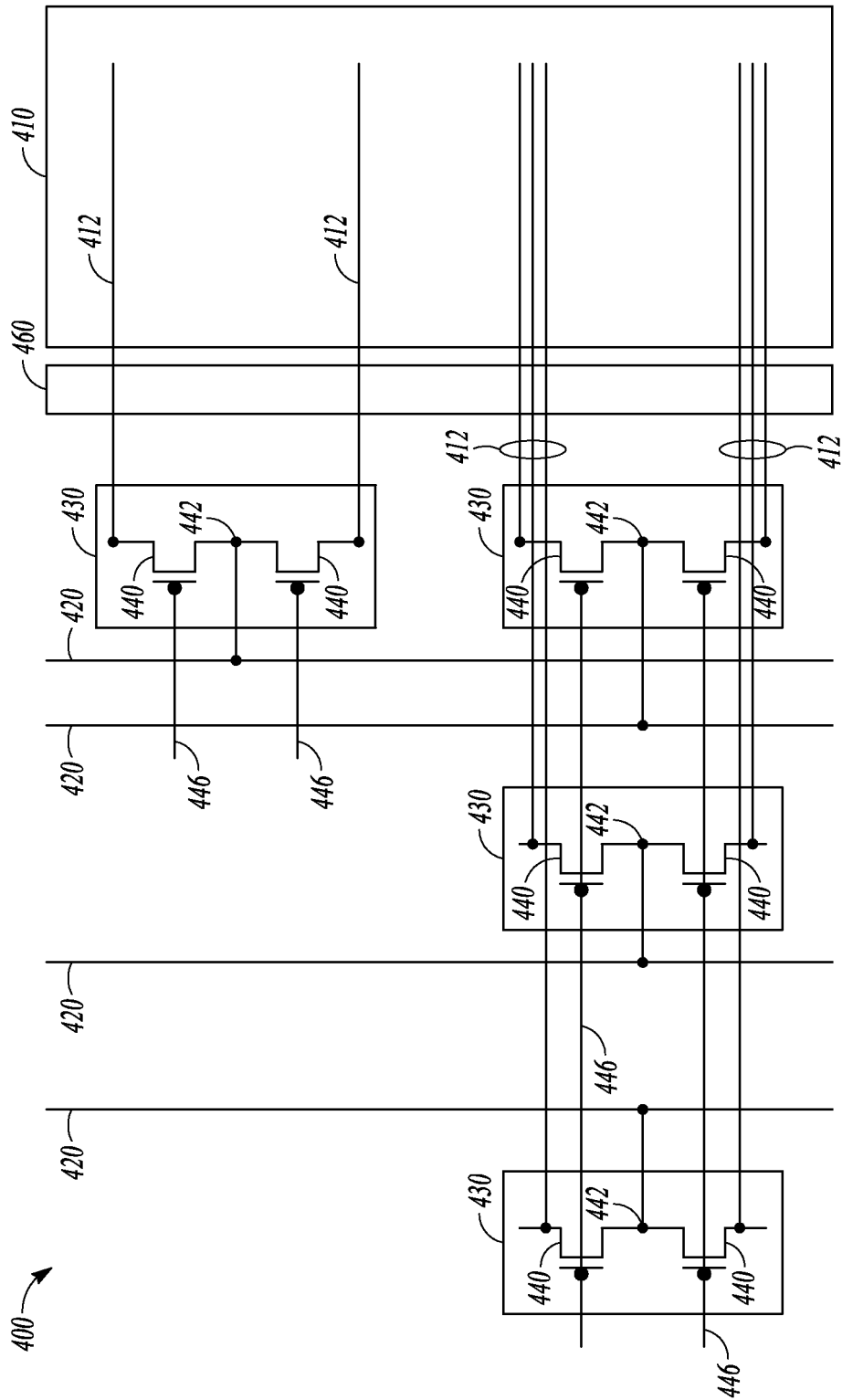
FIG. 4 is an electrical schematic diagram of a memory device according to various embodiments of the invention.

The function of the field plates 156 and 166 is illustrated with reference to the operation of FETs in string driver circuits in a memory device 400. FIG. 4 is an electrical schematic diagram of the memory device 400 according to various embodiments of the invention. The memory device 400 includes an array 410 of memory cells that are coupled to local access lines 412 to receive access signals. Individual local access lines 412 are coupled to respective global access lines 420 by string driver circuits 430 to receive the access signals. Each string driver circuit 430 includes two FETs 440 coupled in series. A node 442 couples a source of one of the FETs 440 to a drain of the other FET 440 in each string driver circuit 430. Each string driver circuit 430 is coupled to one of the global access lines 420 to receive an access signal at the node 442. Each of the FETs 440 has a polysilicon gate 446 to switch it on or off, and some of the polysilicon gates 446 are coupled to more than one of the FETs 440. The local access lines 412 can, for example, be metal outside of the array 410 and polysilicon inside the array 410, such as where the transition of the local access lines 412 from metal to polysilicon occurs in a polysilicon block 460. The local access lines 412 outside of the array 410 may also comprise, for example, any one or more of aluminum, copper or tungsten. Each FET 440 is similar to the FET 100 shown in FIG. 1. The memory device 400 may comprise any number of string driver circuits 430 including more than are shown in FIG. 4. The memory device 400 may comprise string driver circuits 430 located on any side of the array 410, and string driver circuits 430 on more than one side of the array 410. The string driver circuits 430 may be a single continuous device with a shared active area and a shared global access line according to various embodiments of the invention.

Each FET 440 may couple an access signal from one of the global access lines 420 to one of the local access lines 412. The coupling of the access signal is illustrated with reference to the FET 100 shown in FIG. 1. One of the global access lines 420 couples an access signal of approximately 26.5 volts to the source terminal 150 and the source terminal field plate 156. The access signal may vary from 10 to 30 volts according to various embodiments of the invention. At the same time, one of the polysilicon gates 446 couples approximately 30 volts to the polysilicon gate terminal head 146 and the gate terminal 140 to render the channel region 190 conductive. The potential of the gate terminal 140 and the source diffusion region 114 is coupled through the channel region 190 to result in a potential Vpass in the drain diffusion region 116 and the drain terminal 160 that is slightly less than the approximately 26.5 volts on the source terminal 150. The potential Vpass is substantially equal to the approximately 26.5 volts because there is an insignificant drop in voltage in the FET 100. The potential Vpass is a local access signal coupled to one of the local access lines 412 from the drain terminal 160.

The global access lines 420 are positioned near enough to the FETs 440 to cause depletion were it not for the field plates in the FETs 440. For example, the global access lines 420 may be positioned as the lines of metal 176 are positioned relative to the FET 100 shown in FIG. 1. The field plates may substantially prevent a depletion effect in the FETs 440 during operation of the string driver circuit 430 in the following manner.

With reference to the FET 100 shown in FIG. 1, the source terminal field plate 156 and the drain terminal field plate 166 shield the silicon substrate 120 from electromagnetic activity in conductors above the silicon substrate 120 such as, for example, the lines of metal 176. More particularly, the source diffusion region 114 and the drain diffusion region 116 may be subject to depletion or accumulation due to coupling with nearby objects such as the lines of metal 176. The lines of metal 176 may be at 0 volts or may be carrying from 10 to 30 volts. The potential of the source terminal field plate 156 is held to be substantially equal to the potential of the source diffusion region 114 by the source terminal 150. The absence of a substantial potential difference between the source terminal field plate 156 and the source diffusion region 114 shields the source diffusion region 114 from depletion or accumulation that might otherwise be caused by electromagnetic activity around conductors above the source terminal field plate 156. Likewise, the potential of the drain terminal field plate 166 is held to be substantially equal to the potential of the drain diffusion region 116 by the drain terminal 160. The absence of a substantial potential difference between the drain terminal field plate 166 and the drain diffusion region 116 shields the drain diffusion region 116 from depletion or accumulation that might otherwise be caused by electromagnetic activity around conductors above the drain terminal field plate 166. The electric field is substantially contained between the field plates 156 and 166 and the lines of metal 176.

The depletion or accumulation may substantially affect the operation of the FET 100. For example, a depletion of the drain extension region 165 may join with the depletion region 175 in the source and drain diffusion regions 114 and 116 to fully deplete the drain extension region 165. The fully depleted drain extension region 165 would cause a significant drop in the potential Vpass with respect to the access signal of the global access lines 420 described above with respect to FIGS. 1 and 4.

Figure 5:
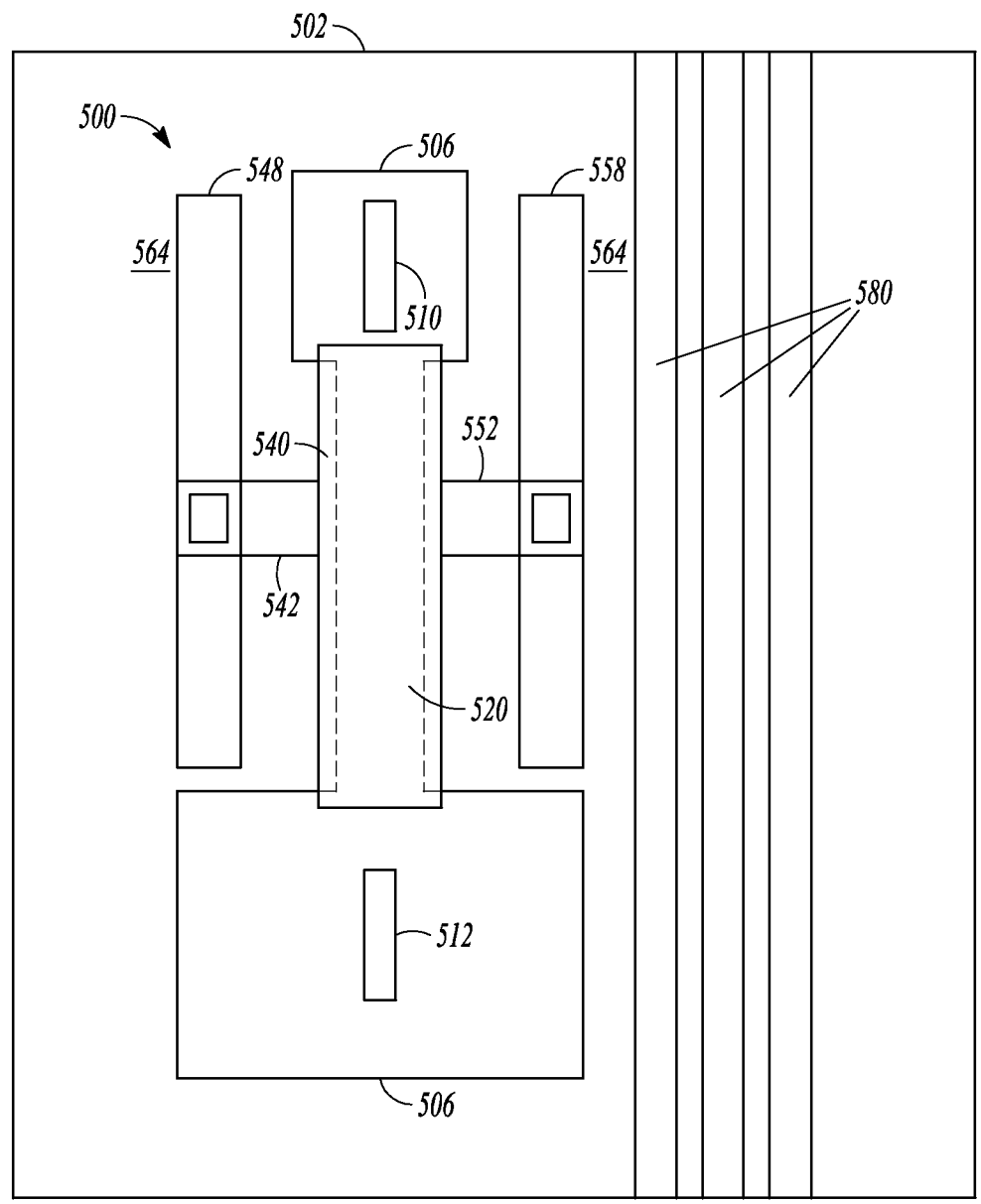
FIG. 5 is a top view of a FET according to various embodiments of the invention.

FIG. 5 is a top view of a FET 500 according to various embodiments of the invention. The FET 500 is located in a silicon substrate 502 and an active area 506 of the FET lies under a first metal terminal 510 and a second metal terminal 512. The active area 506 includes a channel 520 between the metal terminals 510 and 512 through which charge may flow. A metal field plate 540 extends over the entire channel 520 and additional portions of the active area 506, although the field plate 540 does not extend over the metal terminals 510 and 512. The field plate 540 includes a first metal wing 542 that extends from the field plate 540 and is coupled to a first polysilicon structure 548. The field plate 540 also includes a second metal wing 552 that extends from the field plate 540 and is coupled to a second polysilicon structure 558. The first and second polysilicon structures 548 and 558 lie on either side of the FET 500 over an isolation region 564 in the silicon substrate 502. The first and second polysilicon structures 548 and 558 do not extend over the active area 506 but are off to the side and substantially parallel to the active area 506. A number of lines of metal 580 forming a metallization extend over the silicon substrate 502 near the FET 500. The first and second polysilicon structures 548 and 558 shield the FET 500 from electromagnetic activity in conductors near the FET 500 such as, for example, the lines of metal 580. The first and second polysilicon structures 548 and 558 may be doped or undoped. The FET 500 is a high-voltage isolation device according to various embodiments of the invention.

Figure 6:
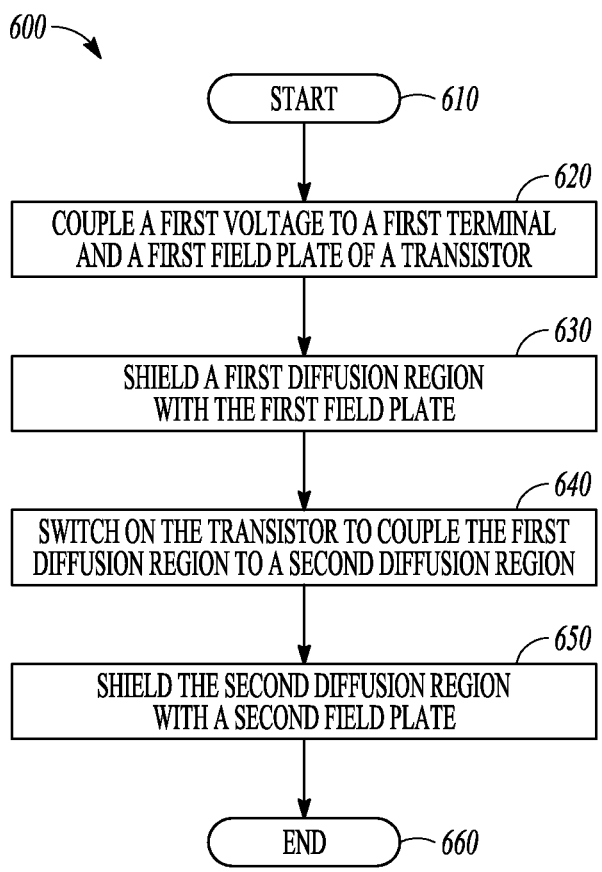
FIG. 6 is a flow diagram of one method according to various embodiments of the invention.

FIG. 6 is a flow diagram of one method 600 according to various embodiments of the invention. In block 610, the method 600 starts. In block 620, a first voltage is coupled to a first terminal and a first field plate of a transistor. In block 630, a first diffusion region in a semiconductor material of the transistor is shielded from conductors with the first field plate, the first diffusion region being coupled to the first voltage through the first terminal such that the first diffusion region is at potential substantially equal to the first voltage. In block 640, the transistor is switched on to couple the first diffusion region to a second diffusion region in the semiconductor material to raise a potential of the second diffusion region. In block 650, the second diffusion region is shielded from conductors with a second field plate coupled to the second diffusion region through a second terminal, the second field plate having a potential substantially equal to a potential of the second diffusion region. In block 660, the method 600 ends. Various embodiments may have more or fewer activities than those shown in FIG. 6. The order of the activities may be changed in some embodiments, and some activities may be deleted, or substituted for other activities.

Figure 7:
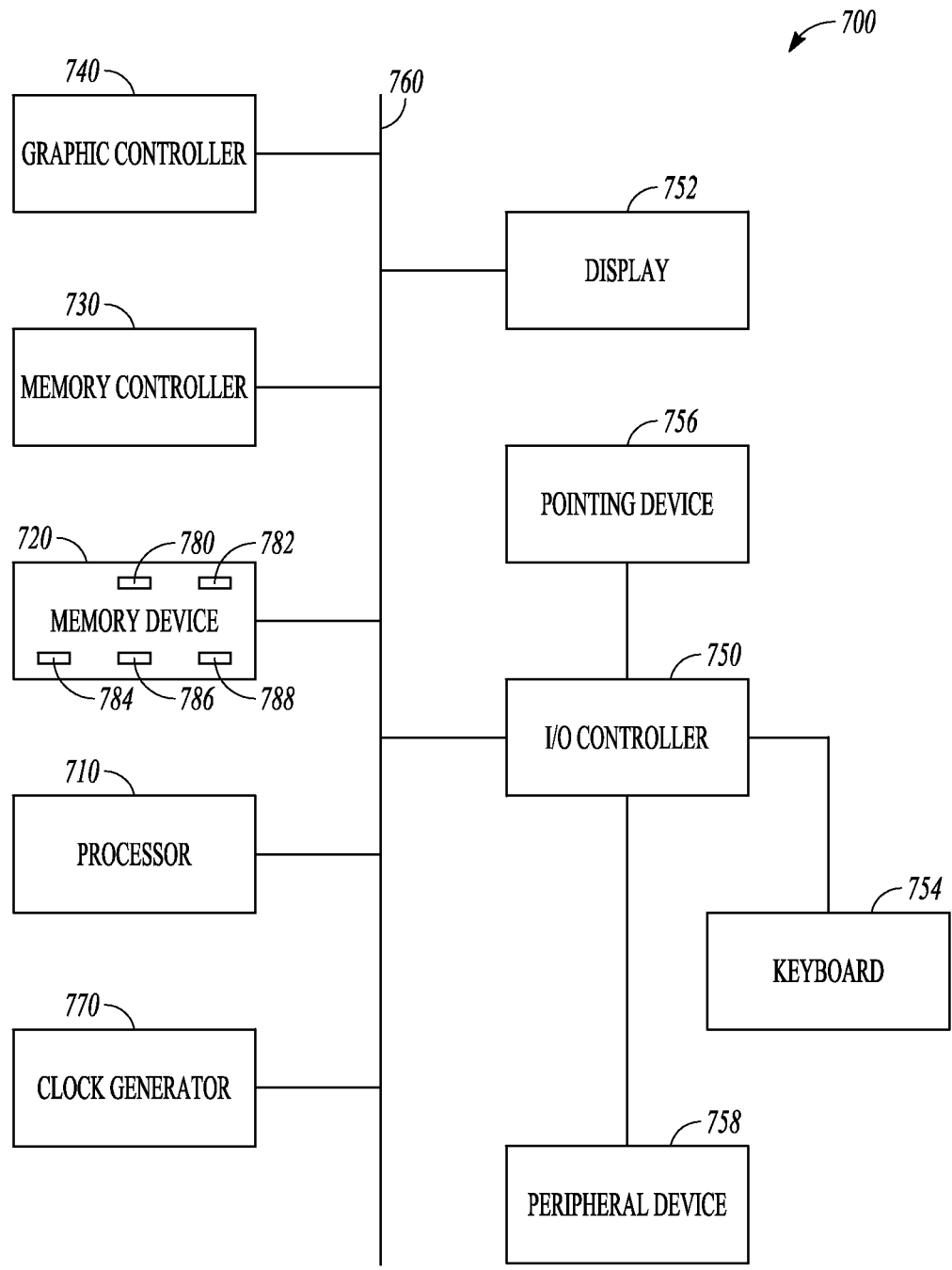
FIG. 7 is a diagram illustrating a system according to various embodiments of the invention.

FIG. 7 is a diagram illustrating a system 700 according to various embodiments of the invention. The system 700 may include a processor 710, a memory device 720, a memory controller 730, a graphic controller 740, an input and output (I/O) controller 750, a display 752, a keyboard 754, a pointing device 756, and a peripheral device 758. A bus 760 couples all of these devices together. A clock generator 770 is coupled to the bus 760 to provide a clock signal to at least one of the devices of the system 700 through the bus 760. The clock generator 770 may include an oscillator in a circuit board such as a motherboard. Two or more devices shown in system 700 may be formed in a single integrated circuit chip.

The bus 760 may include interconnect traces on a circuit board or may comprise one or more cables. The bus 760 may couple the devices of the system 700 by wireless means such as by electromagnetic radiation, for example, radio waves. The peripheral device 758 coupled to the I/O controller 750 may comprise a printer, an optical device such as a CD-ROM and a DVD reader and writer, a magnetic device reader and writer such as a floppy disk driver, or an audio device such as a microphone.

The memory device 720 includes several FETs 780, 782, 784, 786 and 788, which may be constructed according to the description of any one of the FETs shown and described herein, according to various embodiments of the invention. Thus, the FETs 780, 782, 784, 786 and 788 each have one or more field plates to shield diffusion regions from conductors. Other elements of the system 700, such as the processor 710, the memory controller 730, the graphic controller 740, the input and output (I/O) controller 750, the display 752, the keyboard 754, the pointing device 756, and the peripheral device 758 may include one or more FETs with field plates according to various embodiments of the invention.

The system 700 represented by FIG. 7 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

During powered operation, a field plate shown and described herein according to various embodiments of the invention is at substantially the same potential as the diffusion region beneath it to shield the diffusion region and the silicon substrate from electromagnetic activity. The field plate may substantially prevent depletion or accumulation effects in the diffusion region that would otherwise occur due to coupling with nearby objects such as lines of metal.

Any of the circuits or systems described herein may be referred to as a module. A module may comprise a circuit and/or firmware according to various embodiments.

Example FETs, systems, and methods have been described. Although several specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:
1. An apparatus comprising:
a diffusion region in a semiconductor material;
a terminal coupled to the diffusion region;
a polysilicon structure adjacent to and extending from the diffusion region; and a field plate coupled to the terminal and extending from the terminal over the diffusion region and configured to shield the diffusion region, the field plate extending parallel to the polysilicon structure and comprising a metal wing that extends from the field plate to the polysilicon structure.

2. The apparatus of claim 1, wherein the terminal and the field plate each comprise metal.

3. The apparatus of claim 1, wherein the terminal comprises an elongated structure extending from a contact diffusion region inside the diffusion region.

4. The apparatus of claim 3, wherein:
the contact diffusion region comprises an N+ type contact diffusion region; and
the diffusion region comprises an N− type diffusion region.

5. The apparatus of claim 1, wherein the diffusion region comprises a drain extension region.

6. A transistor comprising:
a gate terminal coupled to a gate over an active area in a semiconductor material;
a drain terminal coupled to a drain diffusion region in the semiconductor material;
a source terminal coupled to a source diffusion region in the semiconductor material;
first and second polysilicon structures on either side of and parallel to the active area; and
a field plate coupled to the drain terminal and extending toward the gate terminal and configured to shield the drain diffusion region and the active area from electromagnetic activity, wherein the field plate includes a first metal wing that extends from the field plate to the first polysilicon structure and a second metal wing that extends from the field plate to the second polysilicon structure.

7. The transistor of claim 6, wherein:
the gate terminal has a head; and
the field plate and the head of the gate terminal are separated by a dielectric.

8. The transistor of claim 6, wherein the field plate comprises individual bars.

9. The transistor of claim 8, wherein the individual bars are coupled together by crossbeams.

10. The transistor of claim 8, wherein the field plate extends up to or beyond the active area.

11. The transistor of claim 8, wherein the field plate has a width that is at least as wide as the active area.

12. The transistor of claim 6, wherein the field plate is substantially rectangular.

13. The transistor of claim 6, wherein the field plate comprises a single block of metal.

14. The transistor of claim 6, wherein the field plate comprises a first field plate and further comprising a second field plate coupled to the source terminal and extending toward the gate terminal to shield the source diffusion region from conductors.

15. The transistor of claim 6, wherein the source terminal, the drain terminal and the field plate each comprises at least one of aluminum, copper, tungsten, or polysilicon.

16. The transistor of claim 6, wherein the semiconductor material comprises a silicon substrate.

17. A transistor comprising:
a first terminal coupled to an active area in a semiconductor material;
a second terminal coupled to the active area in the semiconductor material, wherein the active area extends from the first terminal to the second terminal; and
a polysilicon structure adjacent to the active area and configured to shield the active area wherein the polysilicon structure is coupled to a metal field plate, the metal field plate being located over a portion of the active area in the semiconductor material wherein the metal field plate includes a metal wing that extends from the field plate and is coupled to the polysilicon structure.

18. The transistor of claim 17, wherein the active area includes a channel region and the metal field plate extends over the entire channel region.

19. The transistor of claim 18, wherein the metal field plate does not extend over the first and second terminals.

20. The transistor of claim 17, wherein the polysilicon structure is over an isolation region in the semiconductor material.

21. The transistor of claim 17, wherein the polysilicon structure does not extend over the active area in the semiconductor material.

22. The transistor of claim 21, wherein the polysilicon structure is substantially parallel to the active area.

23. The transistor of claim 17, wherein the polysilicon structure comprises:
a first polysilicon structure adjacent to a first side of the active area in the semiconductor material; and
a second polysilicon structure adjacent to a second side of the active area in the semiconductor material.

* * * * *